(12) United States Patent
Omori et al.

(10) Patent No.: US 8,309,923 B2
(45) Date of Patent: Nov. 13, 2012

(54) SAMPLE OBSERVING METHOD AND SCANNING ELECTRON MICROSCOPE

(75) Inventors: Seiko Omori, Ashiya (JP); Zhaohui Cheng, Tokyo (JP); Hideyuki Kazumi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/148,864

(22) PCT Filed: Feb. 9, 2010

(86) PCT No.: PCT/JP2010/000778
§ 371 (c)(1),
(2), (4) Date: Aug. 10, 2011

(87) PCT Pub. No.: WO2010/095392
PCT Pub. Date: Aug. 26, 2010

(65) Prior Publication Data
US 2011/0303843 A1 Dec. 15, 2011

(30) Foreign Application Priority Data
Feb. 20, 2009 (JP) ................................. 2009-037733

(51) Int. Cl.
*H01J 37/28* (2006.01)
*G01N 23/04* (2006.01)
(52) U.S. Cl. ......... 250/310; 250/305; 250/306; 250/307
(58) Field of Classification Search .................. 250/305, 250/306, 307, 310
See application file for complete search history.

(56) References Cited

U.S. PATENT DOCUMENTS

| 5,412,209 | A | 5/1995 | Otaka et al. |
| 6,570,156 | B1 * | 5/2003 | Tsuneta et al. ................. 250/311 |
| 7,187,345 | B2 * | 3/2007 | Kobaru et al. ................... 345/10 |
| 7,633,061 | B2 * | 12/2009 | Tanaka et al. .................. 250/306 |
| 7,695,872 | B2 * | 4/2010 | Vernon et al. ...................... 430/5 |
| 7,737,412 | B2 * | 6/2010 | Jin et al. .................... 250/396 R |
| 7,960,696 | B2 * | 6/2011 | Ezumi et al. .................. 250/310 |
| 8,203,120 | B2 * | 6/2012 | Zewail ........................... 250/310 |
| 2005/0121610 | A1 | 6/2005 | Abe |
| 2008/0116375 | A1 | 5/2008 | Ikegami et al. |
| 2009/0166558 | A1* | 7/2009 | Nagayama ............... 250/442.11 |
| 2009/0218491 | A1 | 9/2009 | Morokuma et al. |
| 2009/0224170 | A1 | 9/2009 | Yamazaki et al. |
| 2011/0068265 | A1 | 3/2011 | Arai et al. |

(Continued)

FOREIGN PATENT DOCUMENTS
JP       63-168946 A     7/1988
(Continued)

*Primary Examiner* — David A Vanore
(74) *Attorney, Agent, or Firm* — Mattingly & Malur, PC

(57) ABSTRACT

Provided is a sample observing method wherein the effect on throughput is minimized, and a pattern profile can be obtained at high accuracy even in a complicated LSI pattern, regardless of the scanning direction of an electron beam. In the sample observing method, the presence or absence of an edge parallel to a scanning direction (707) of an electron beam is judged regarding an edge (708) of a pattern to be observed (S702); if the edge is present, an area in the vicinity of the pattern edge is designated as a local pre-dose area (709) (S703); a local pre-dose of an electron beam is performed, so that the initial charged state is controlled not to return secondary electrons generated by irradiation of an electron beam when an image is captured, to the surface of a sample.

11 Claims, 7 Drawing Sheets

U.S. PATENT DOCUMENTS

| | | | |
|---|---|---|---|
| 2011/0174971 A1* | 7/2011 | Malac et al. | 250/307 |
| 2011/0215243 A1* | 9/2011 | Ezumi et al. | 250/307 |
| 2011/0303843 A1* | 12/2011 | Omori et al. | 250/307 |
| 2012/0153145 A1* | 6/2012 | Cheng et al. | 250/307 |

FOREIGN PATENT DOCUMENTS

| | | |
|---|---|---|
| JP | 05-151927 A | 6/1993 |
| JP | 2005-116795 A | 4/2005 |
| JP | 2005-345272 A | 12/2005 |
| JP | 2007-272593 A | 10/2007 |
| JP | 2008-123716 A | 5/2008 |
| JP | 2000-211962 A | 9/2009 |
| JP | 2009-277587 A | 11/2009 |
| WO | 2007/094439 A1 | 8/2007 |

* cited by examiner

FIG. 1
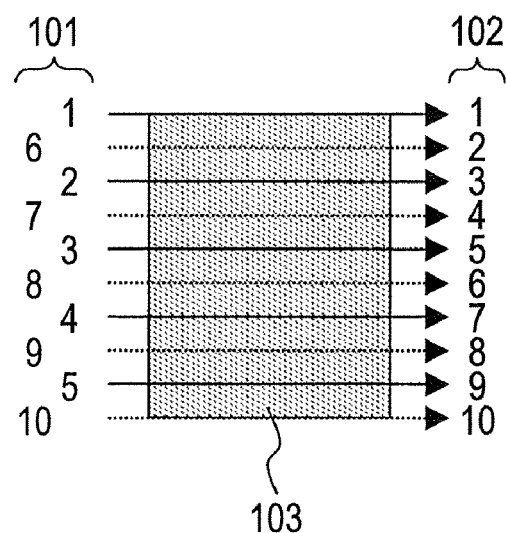
FIG. 2A
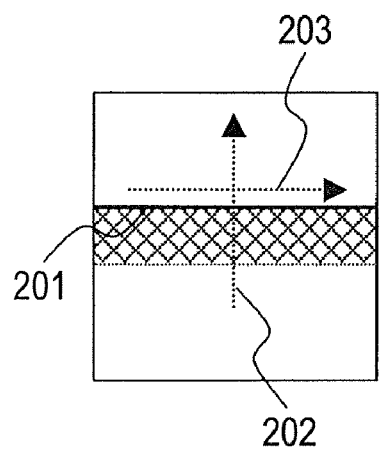
FIG. 2B
| | LINE PROFILE ACROSS PATTERN EDGE 201 |
|---|---|
| SCANNING DIRECTION 202 | SHARP RISING |
| SCANNING DIRECTION 203 | BROAD RISING |

SAMPLE OBSERVING METHOD AND SCANNING ELECTRON MICROSCOPE

TECHNICAL FIELD

The present invention relates to a sample observing method using a scanning electron microscope.

BACKGROUND

When observing a sample (wafer having an LSI pattern formed thereon) using an electron beam applied device, for example, scanning electron microscope (SEM: Scanning Electron Microscope), electron beams emitted from an electron gun are deflected by a scanning deflector so that a secondary electron, reflecting electron and backscatter electron generated from the sample surface are detected by electron beam scanning. The resultant signal is processed to capture an image.

FIG. 1 shows a generally employed scanning (hereinafter referred to as interlace scanning). A reference numeral 101 denotes a scanning order, 102 denotes a scanning line number, and 103 denotes a scanning area. In the generally employed image display process, a secondary electron signal obtained at a scanning position on the sample is transferred to an element (pixel) for image display so that the two-dimensional image is displayed. The elements for image display are arranged uniformly in horizontal/vertical directions. In case of the interlace scanning, after the horizontal scanning, one row in the vertical direction is skipped, and then the horizontal scanning is conducted again. The similar operation will be repeatedly conducted with respect to the skipped row. Japanese Patent Application Laid-Open Publication Nos. 2008-123716 and 5-151927 disclose the operation of the generally employed electron microscope.

SUMMARY OF THE INVENTION

When scanning irregular shape such as the LSI pattern and the portion formed of different material, the charged state varies depending on the pattern shape and scanning direction of the electron beam, which may cause fluctuation in contrast of the SEM image.

For example, contrast and image resolution of an edge portion intersecting the electron beam scanning direction at a right angle may be different from those of the edge portion in parallel with the scanning direction. This phenomenon is observed as fluctuation of the line profile indicating a gradation level of the edge portion. For example, referring to FIGS. 2A and 2B, when a scanning 202 are conducted in the direction vertical to a pattern edge 201, sharp rising of the line profile is observed. When a scanning 203 is conducted in parallel with the pattern edge 201, broad rising is observed.

The cause responsible for the phenomenon as described above will be explained referring to FIGS. 3A and 3B. In FIGS. 3A and 3B, a reference numeral 301 denotes an electron beam, 302 denotes an insulator (photoresist and the like) pattern, 303 denotes positive charge on the sample surface resulting from electron beam irradiation, 304 denotes a secondary electron generated by the electron beam irradiation, 305 denotes a scanning direction in parallel with the insulator pattern 302, and 306 denotes a scanning direction vertical to the insulator pattern 302.

FIG. 3A illustrates the electron beam scanning in the parallel direction 305 with respect to the insulator pattern 302. In this case, the positive charge 303 on the sample surface is intensified because of continuous scanning with respect to the insulator portion so that the secondary electron 304 generated by the electron beam irradiation tends to be returned to the sample surface. As a result, secondary electron detection efficiency is lowered, which makes it difficult to extract the pattern profile.

Meanwhile, FIG. 3B illustrates the electron beam scanning in the vertical direction 306 with respect to the insulator pattern 302. Compared to the case shown in FIG. 3A, the distance for continuously scanning the insulator is short, and accordingly, intensity of the positive charge 303 on the sample surface is not high, and accordingly, the secondary electron 304 generated by the electron beam irradiation is unlikely to be returned to the sample surface.

The resolution of the edge may vary depending on the electron beam scanning direction in spite of the same pattern shape. In case of the wiring pattern such as the simple line pattern which has been subjected to the measurement before, the image is captured in the scanning direction orthogonal to the longitudinal direction of the pattern. No particular trouble has occurred in the resolution of the edge portion so far. However, recent complicated LSI pattern has made it difficult for one-dimensional measurement of the wiring pattern to sufficiently evaluate the shape and control the process.

As described above, the interlace scanning may cause fluctuation in the contrast depending on the pattern shape and scanning direction, and change in the resolution depending on the edge direction. Accordingly, two-dimensional shape measurement based on the image derived from the interlace scanning may add the influence of the scanning direction to the measurement result, thus failing to obtain accurate measurement results.

Japanese Patent Application Laid-Open Publication No. 2008-123716 discloses the technology which discriminates the secondary electron energy using the energy filter, measures fluctuation in the sample potential based on the change in the obtained electron yield, extracts time constant of charge formed upon electron beam irradiation, optimizes the interlace scanning interval based on the extracted time constant, and suppresses strain which appears on the SEM image and magnification fluctuation. This method is expected to provide the effect with respect to the aforementioned task to a certain level. However, it is predicted to make it difficult to optimize the scanning interval conforming to the LSI pattern shape expected to be further complicated in future.

Japanese Patent Application Laid-Open Publication No. 5-151927 proposes the method for improving the secondary electron detection efficiency by performing pre-dose over the entire surface of the observing area, or wider area. However, pre-dosing on the organic substance such as the resist may damage the pattern itself, thus failing to capture the image with correct shape. Pre-dosing over the entire surface of the observation area requires to take time, thus deteriorating throughput.

It is an object of the present invention to provide a sample observing method for obtaining the pattern profile with high accuracy even in a complicated LSI pattern, regardless of the electron beam scanning direction while minimizing the effect on the throughput.

It is another object of the present invention to provide a sample observing method with less pattern damage when observing the resist pattern.

As one form for achieving the aforementioned objects, the sample observing method using a scanning electron microscope includes steps of judging presence or absence of a pattern edge having a portion in parallel with a scanning direction of an electron beam of the scanning electron microscope among edges of an observation pattern, selectively designating an area around the pattern edge that has been judged as the presence in the judgment step as a pre-dose area, performing a pre-dose with respect to the designated pre-dose area using the electron beam, and capturing an image of the observation pattern through irradiation of the electron beam.

The present invention is capable of providing the sample observing method which allows capture of the pattern profile with high accuracy even in the complicated LSI pattern, regardless of the electron beam scanning direction while minimizing the effect on the throughput.

BRIEF DESCRIPTION OF DRAWINGS

FIG. 1 is an explanatory view for explaining a scanning procedure of an interlace scanning (related art scanning).

FIGS. 2A and 2B are an explanatory view for explaining a correlation between the electron beam scanning direction and the peak intensity of the line profile, wherein FIG. 2A is a plan view showing a relationship between the scanning direction and the line pattern edge, and FIG. 2B is a view showing the correlation between the scanning direction and the line profile.

FIGS. 3A and 3B are an explanatory view for explaining the state where the secondary electrons generated by the electron beam scanning are returned to the sample surface, wherein FIG. 3A shows the case where the scanning direction and the line pattern are in the same direction, and FIG. 3B shows the case where the scanning direction and the line pattern intersect at a right angle.

FIGS. 7A, 7B and 7C are an explanatory view of Example 1, wherein FIG. 7A is a flowchart of the sample observing method, FIG. 7B shows the method for designating the local pre-dose area, and FIG. 7C shows a mask file for the local pre-dose.

FIGS. 8A, 8B and 8C are an explanatory view of Example 2, wherein FIG. 8A is a flowchart of the sample observing method, FIG. 8B shows the method for designating the local pre-dose area, and FIG. 8C shows a mask file for the local pre-dose.

FIGS. 9A, 9B and 9C are an explanatory view for explaining the effect of the present invention, wherein FIG. 9A is a pattern diagram of an image captured by scanning the electron line without performing the local pre-dose, FIG. 9B is a pattern diagram of the image captured by scanning the electron line after performing the local pre-dose, and FIG. 9C is a pattern diagram of the image in accordance with the design information.

DESCRIPTION OF EMBODIMENTS

Figure 3A:
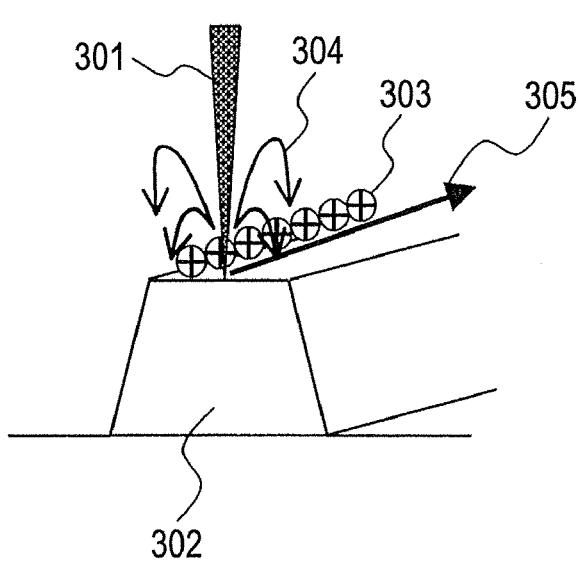
Figure 3B:
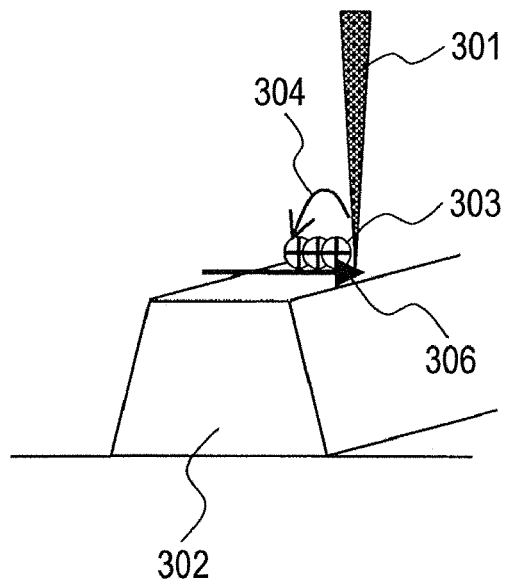

The present invention will be described in detail referring to the drawings.

Figure 4:
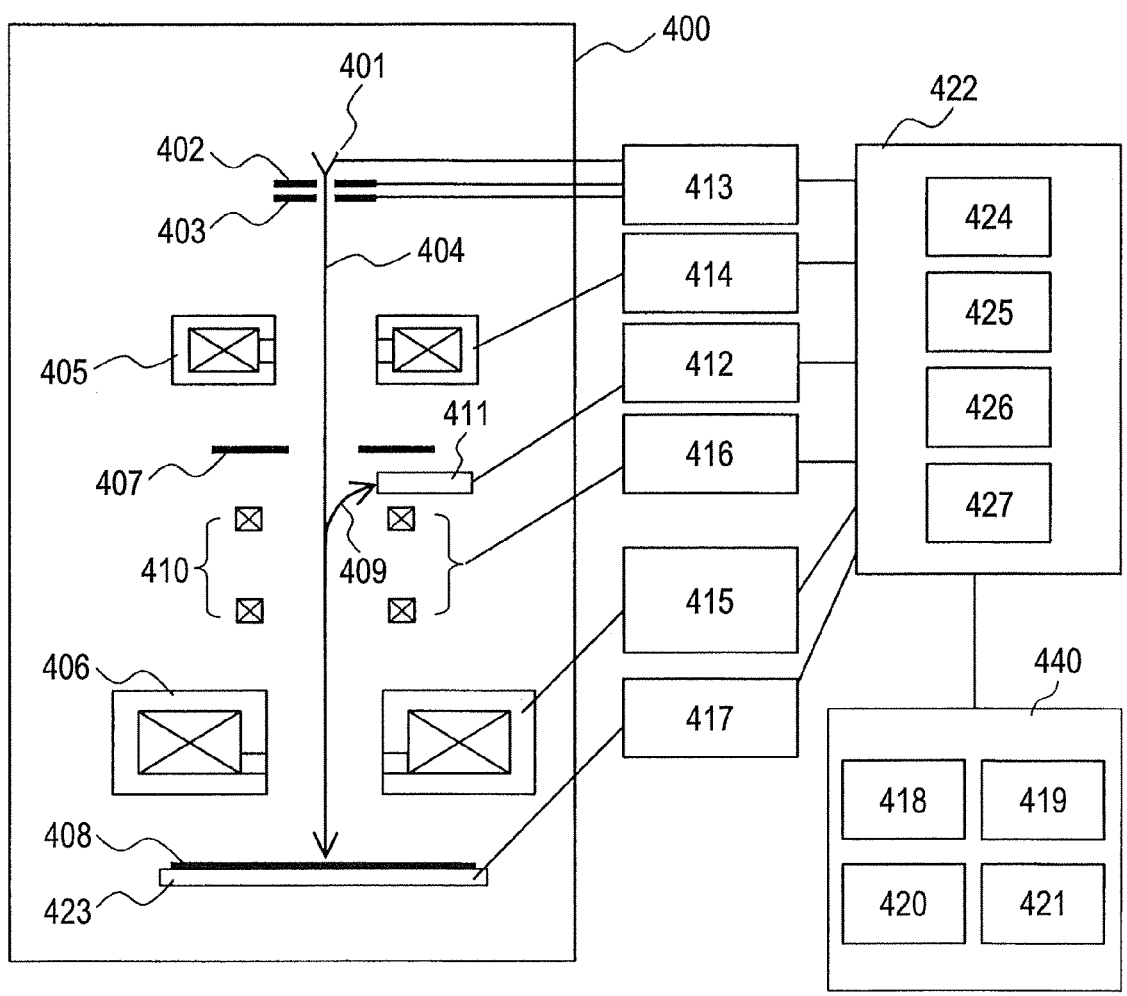
FIG. 4 is a schematic view representing a device structure of a scanning electron microscope used for the sample observing method according to the present invention.

Referring to FIG. 4, structure of a scanning electron microscope (SEM) used for the sample observing method will be described. The process of locally pre-dosing the selectively designated area will be referred to as "local pre-dose".

[Device Structure]

A block diagram in FIG. 4 illustrates the device structure of the scanning electron microscope used for the sample observing method according to the present invention. A reference numeral 400 denotes a housing of the SEM. An electron source includes a cathode 401 and a first anode 402. A voltage is applied between the cathode 401 and the first anode 402 by a high-voltage power supply 413 controlled by a control arithmetic unit 422 so that predetermined emission current is extracted from the cathode 401. Accelerating voltage is applied between the cathode 401 and a second anode 403 by the high-voltage power supply 413 controlled by the arithmetic unit 422 so that a primary electron beam 404 emitted from the cathode 401 is accelerated to proceed to a lens system in a subsequent stage. The primary electron beam 404 is focused on a condenser lens 405 controlled by a condenser lens control power supply 414, and unnecessary area of the primary electron beam 404 is removed by a throttle plate 407.

Thereafter, the primary electron beam 404 is focused on a sample 408 as a micro spot by an objective lens 406 controlled by an objective lens control power supply 415, and is two-dimensionally scanned on the sample by a deflector 410. A scanning signal of the deflector 410 is controlled by a deflector control power supply 416 in accordance with the observation magnification. The sample 408 is fixed on a sample stage 423 that is two-dimensionally movable. Movement of the sample stage 423 is controlled by a stage control unit 417.

A secondary electron (electric signal) 409 generated from the sample 408 through irradiation of the primary electron beam 404 is detected by a secondary electron detector 411. A drawing unit 420 controls so that the detected secondary electron signal is converted into a visual signal, which is appropriately arranged on another plane. Then the image in accordance with the surface shape of the sample is displayed on an SEM image display unit 418 as an SEM image. The drawing unit 420 and the SEM image display unit 418 are provided in a separately installed computer 440.

The signal detected by the secondary electron detector 411 is amplified by a signal amplifier 412, and stored in an image memory in the drawing unit 420 via the control arithmetic unit 422.

An address signal corresponding to the memory position of the image memory in the drawing unit 420 is generated in the control arithmetic unit 422, and converted into an analog signal. In case of the image memory formed of 512×512 pixels in the drawing unit 420, the address signal in X direction, which is supplied to the deflector 410 is an iterative digital signal from 0 to 512. The address signal in Y direction is an iterative digital signal from 0 to 512, which is incremented when the address signal in X direction reaches 512 from 0. The aforementioned signal is converted into the analog signal.

As the address of the image memory in the drawing unit 420 corresponds to the address of a deflection signal for scanning the electron beam, the two-dimensional image in the electron beam deflection area through the deflector 410 is recorded in the image memory. The signal in the image memory may be sequentially read in chronological order by a reading address generation circuit in synchronization with the read clock. The signal read corresponding to the address is converted into the analog signal as a brightness modulation signal of the SEM image display unit 418.

The image memory in the drawing unit 420 includes a function for recording superimposed (synthesized) images (image data) for the purpose of improving S/N. For example, images derived from the two-dimensional scanning which has been conducted eight times are superimposed and recorded for forming a single completed image. That is, images formed by conducting a unit of X-Y scanning once or more times are synthesized to form the final image. The number of images for forming the single final SEM image (hereinafter referred to as a frame integrated number) may be arbitrarily set, and set to an appropriate value in consideration of the condition such as the secondary electron generation efficiency.

An input unit 419 serves as an interface between an operator and the arithmetic unit 422. The operator controls the respective units as described above via the input unit 419, and further designates measurement points and instructs dimension measurement. Likewise the drawing unit 420 and the SEM image display unit 418, the input unit 419 is provided in the separately installed computer 440.

The unit 422 is provided with a line profile extraction function 424 for extracting a profile of an observation pattern based on the detected secondary electron. The line profile is formed based on the detection amount of electron when scanning the primary electron beam, or brightness information of the SEM image. It indicates the gradation level of the pattern edge portion. The captured line profile is used for the dimension measurement of the pattern formed on the semiconductor wafer, for example. The unit 422 employs the line profile for a function 425 for judging with respect to possibility of extraction of the pattern profile.

A storage unit 421 stores the pattern edge shape information of the inspection object. Likewise the drawing unit 420, the SEM image display unit 418, and the input unit 419, the storage unit 421 is provided in the separately installed computer 440. The control arithmetic unit 422 includes a pattern layout judgment function 426 for judging whether or not the pattern edges in parallel with the electron beam scanning direction are contained based on the shape information stored in the storage unit 421.

The control arithmetic unit 422 includes a function 427 for designating a local pre-dose area. If the inspection object contains the pattern edge in parallel with the electron beam scanning direction, the function 427 for designating the local pre-dose area makes a mask file for the local pre-dose. The thus made mask file is stored in the storage unit 421.

[Principle of Charge Control]

In order to capture the image which is never influenced by the scanning direction, or has the negligible influence, it is considered as effective to employ the method for preliminarily controlling the initial charged state around the pattern edge before capturing the image.

The relationship between the electron beam irradiation condition upon the local pre-dose and the charge polarity on the sample surface becomes an important factor for controlling the initial charged state of the sample surface by performing the local pre-dose.

Figure 5:
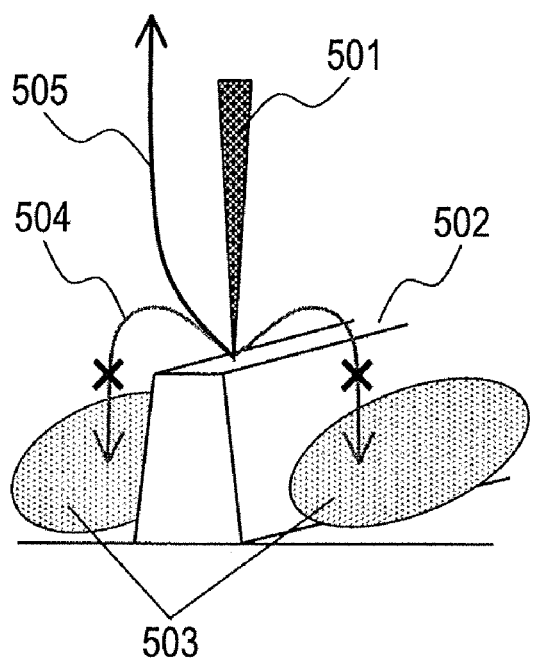
FIG. 5 is an explanatory view for explaining an optimum form for conducting the initial charge control through local pre-doze.

In order to prevent the secondary electron generated by electron beam irradiation upon capturing of the image from being returned to the sample surface, it is preferable to control the region around an observation pattern 502 to be brought into the negatively charged state as shown in FIG. 5. A reference numeral 501 denotes an electron beam, 502 denotes an insulator pattern (observation pattern), 503 denotes the state where both sides of the pattern are negatively charged through the local pre-dose, 504 denotes the state where the secondary electron is prevented from being returned through the negative charging, and 505 denotes the secondary electron to be detected. The local pre-dose is performed to interpose both sides of the pattern for negative charging so that the secondary electron upon image capture is not returned to the sample surface. Use of this method may improve detection in terms of amount of the secondary electrons.

The electron beam irradiation condition is an essential parameter for executing the charge control upon the local pre-dose so that the polarity becomes negative. For the purpose of explaining principle of the present invention, relationship between irradiation energy and charged polarity will be clarified hereinafter.

Figure 6:
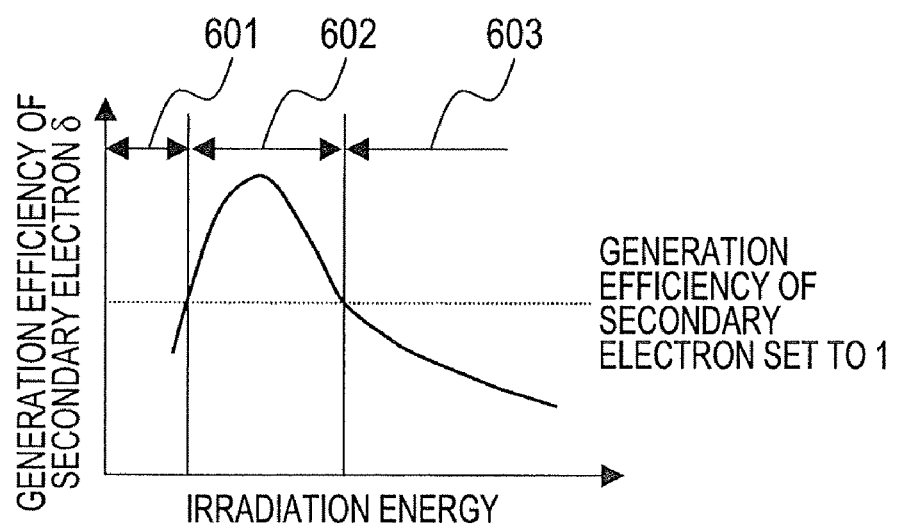
FIG. 6 is a view showing secondary electron generation efficiency δ relative to the irradiation energy.

Charging on the sample surface by the electron beam irradiation is determined by the secondary electron generation efficiency $\delta$ defined as (secondary electron quantity)/(primary electron quantity). FIG. 6 represents characteristics of the secondary electron generation efficiency $\delta$. The irradiation energy is divided into three ranges (601, 602, 603) with respect to the boundary at which the secondary electron generation efficiency $\delta$ is set to 1, that is, the irradiation energy having number of the primary electrons coincided with that of the secondary electrons. In the irradiation energy ranges 601 and 603, number of the secondary electrons is smaller than that of the primary electrons, and accordingly, the sample is negatively charged. Meanwhile, in the irradiation energy range 602, the number of the secondary electrons is larger than that of the primary electrons, and accordingly, the sample is positively charged. If the sample is positively charged at several Vs, the secondary electron with lower energy at several eVs may be returned to the sample surface. This phenomenon allows the sample surface to be negatively charged by selecting the irradiation energy range.

In consideration of the above-described principle, if the electron beam scanning direction is in parallel with the pattern edge, the electron beam irradiation condition (irradiation energy, dose amount) upon local pre-dose may be set so that the area around the pattern edge (designated area) is negatively charged selectively for preventing the secondary electrons generated by the electron beam irradiation upon image capture from returning to the sample surface. This will be further described based on examples hereinafter.

EXAMPLE 1

Figure 7A:
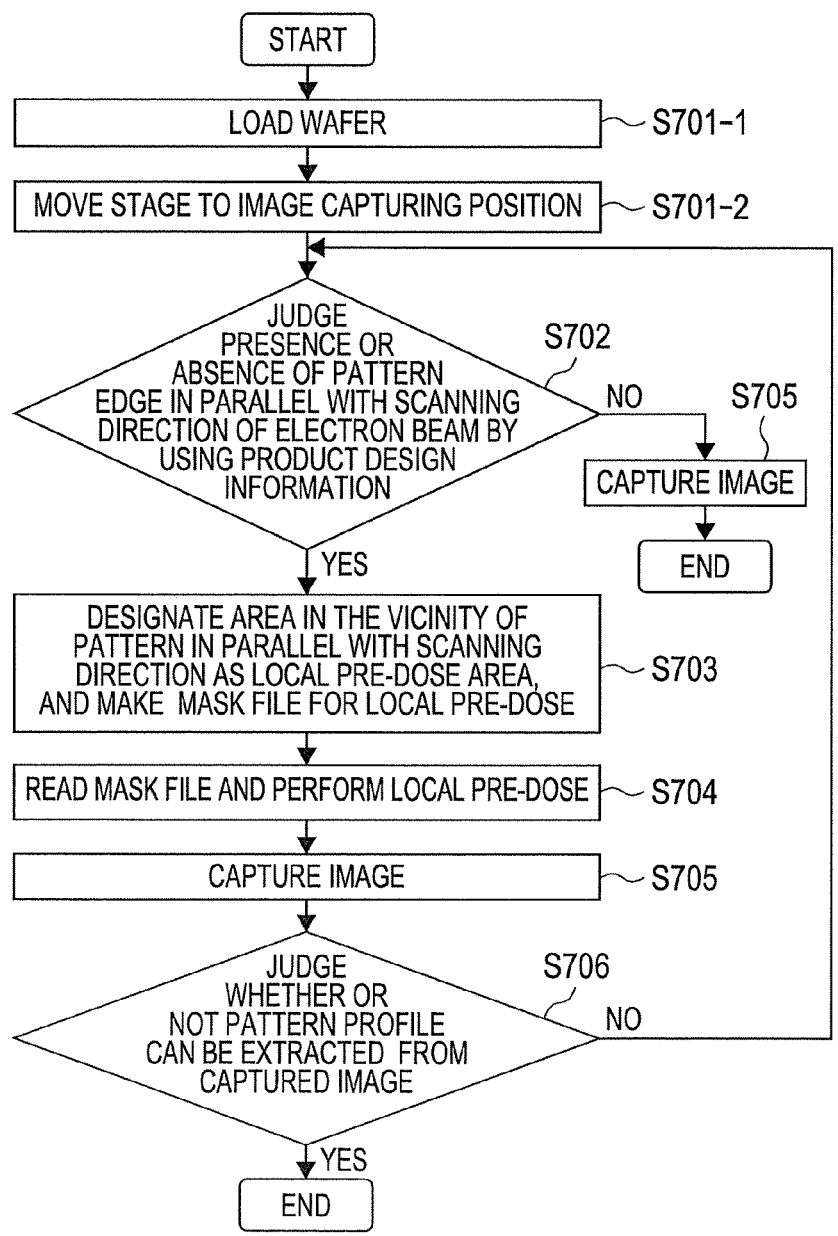
Figure 7B:
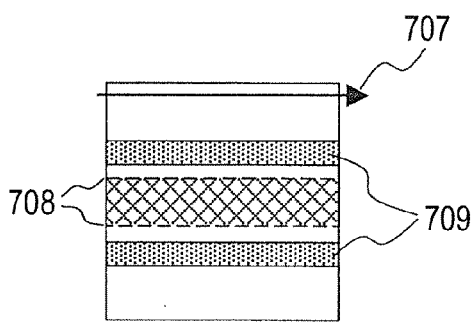
Figure 7C:
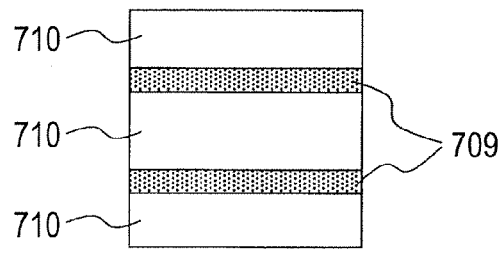

Example 1 will be described referring to FIGS. 7A, 7B and 7C. The description that will not be explained herein is the same as the one which has been explained in the aforementioned [Principle of charge control][Device structure].

In this example, a resist pattern is used as the observation object. A line width and a film thickness of the resist pattern to be observed are set to 100 nm and 150 nm, respectively. FIG. 7A is a flowchart representing a specific procedure of the sample observation method according to the example.

The wafer is loaded in a sample chamber of the SEM (S701-1), and the stage is moved to an image capturing position (S701-2). Then a pattern layout judgment function 426 (see FIG. 4) is enabled to judge whether or not the pattern edge in parallel with the electron beam scanning direction is contained by using shape information of the observation pattern in the product design information (S702).

If it is judged that the relevant pattern edge is not contained (NO), the image of the observation pattern is captured (final image capture), and the process ends. If it is judged that the relevant pattern edge is contained (YES), a local pre-dose area designation function 427 (see FIG. 4) is enabled to designate a local pre-dose area 709 as shown in FIG. 7B based on the design information. A mask file (FIG. 7C) for the local pre-dosing is made in accordance with the relevant information (S703). The thus made mask file is stored in the storage unit 421 (see FIG. 4). Referring to FIGS. 7B and 7C, a reference numeral 707 denotes the electron beam scanning direction, 708 denotes the pattern edge in parallel with the scanning direction, 709 denotes the designated local pre-dose area, and 710 denotes the area to which the electron beam is not irradiated upon the local pre-dose.

The mask file stored in the storage unit 421 (see FIG. 4) is read, and the local pre-dose is conducted (S704). The condition for the local pre-dose will be described hereinafter. The local pre-dose area has a start point approximately 20 nm apart from the pattern edge, and a width of 50 nm. Under the electron beam irradiation condition, the irradiation energy is set to 10V, and the dose amount is set to 2330 µC per unit square centimeter. Upon completion of the local pre-dose, the final image capture condition is selected for capturing the image (S705). Under the electron beam irradiation condition at this time, the irradiation energy is set to 300 V, and the dose amount is set to 440 µC per unit square centimeter.

The line profile of the image captured by the line profile extraction function 424 (see FIG. 4) is extracted. The pattern profile extraction judgment function 425 (see FIG. 4) is enabled to calculate the peak intensity of the line profile to judge with respect to possibility of the pattern profile extraction (S706).

If extraction is successful (YES), the process ends. If it is not successful (NO), the pattern is shifted to the new one so that the process is executed from step S702 again. If the observation object is formed of the material other than the organic substance such as the resist (inorganic material such as silicon dioxide and silicon nitride), and the damage caused by the electron line irradiation is relatively low, the process may be executed on the same position again without shifting to the new pattern. As the required time taken from start of the local pre-dose to the end of image capture is in the order of ms, it may be considered that the effect of the local pre-dose is sustainable, that is, the amount of change in the charging level is negligible.

The designated pre-dose area is adjustable in accordance with the desired size of the pixel for forming the image. In this example, the local pre-dose is performed at the position 20 nm apart from the pattern edge. However, it may be close to the pattern edge so as not to be subjected to the electron irradiation. The width of the local pre-dose is set to 50 nm. However, it may be set to be in the range from 20 nm to 100 nm.

Figure 9A:
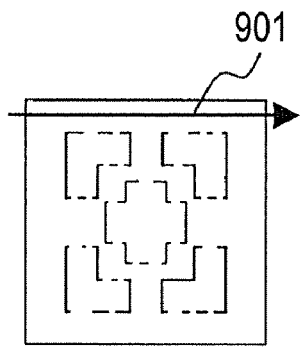
Figure 9B:
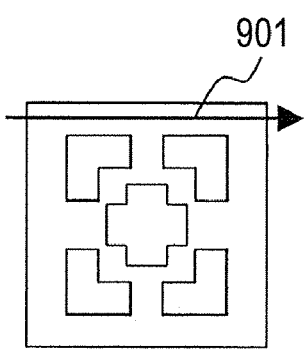
Figure 9C:
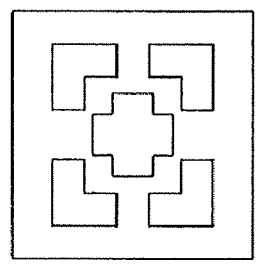

Observation of the wafer with more complicated pattern than the one described in the example will be explained referring to FIGS. 9A, 9B and 9C. FIG. 9A shows an image captured using the generally employed scanning. FIG. 9B shows the image captured through the present invention. FIG. 9C shows the design information. Referring to FIG. 9B, use of the present invention allows extraction of the pattern profile that is missed in the image captured through the generally employed scanning, and capture of the image in accordance with the design information shown in FIG. 9C. Application of the method according to the example to the production control of the semiconductor device makes it possible to reduce the false image recognition rate. A reference numeral 901 shown in FIGS. 9A, 9B and 9C denotes the electron beam scanning direction.

If the pattern edge in parallel with the electron beam scanning direction is present, the local pre-dose is performed to control the initial charged state so as to allow suppression of the secondary electron quantity returned to the sample surface. This example is capable of providing the sample observation method which allows extraction of the arbitrary pattern profile with high accuracy even in the complicated LSI pattern regardless of the electron beam scanning direction.

The time for performing the local pre-dose may be shorter than the time for performing pre-dose over the entire surface of the observation field, thus suppressing reduction in the throughput. The pattern using the organic substance such as the resist pattern is not subjected to the electron beam irradiation upon the local pre-dose, and accordingly, the sample observing method with less pattern damage may be provided. No electron beam is irradiated to the organic pattern such as the resist pattern so that the substance such as carbon does not scatter, thus preventing contamination of the pattern as the observation substance and the inside of the sample chamber upon the local pre-dose. The sample observation method is applicable to the production control of the semiconductor device. The present invention provides the scanning electron microscope which includes a pattern layout judgment function for judging whether or not any edge of those of the observation pattern in parallel with the electron beam is contained, and a pre-dose area designation function for designating the selected area around the edge of the observation pattern when it is judged as presence of the edge, which is preferred for the sample observation method.

EXAMPLE 2

Figure 8A:
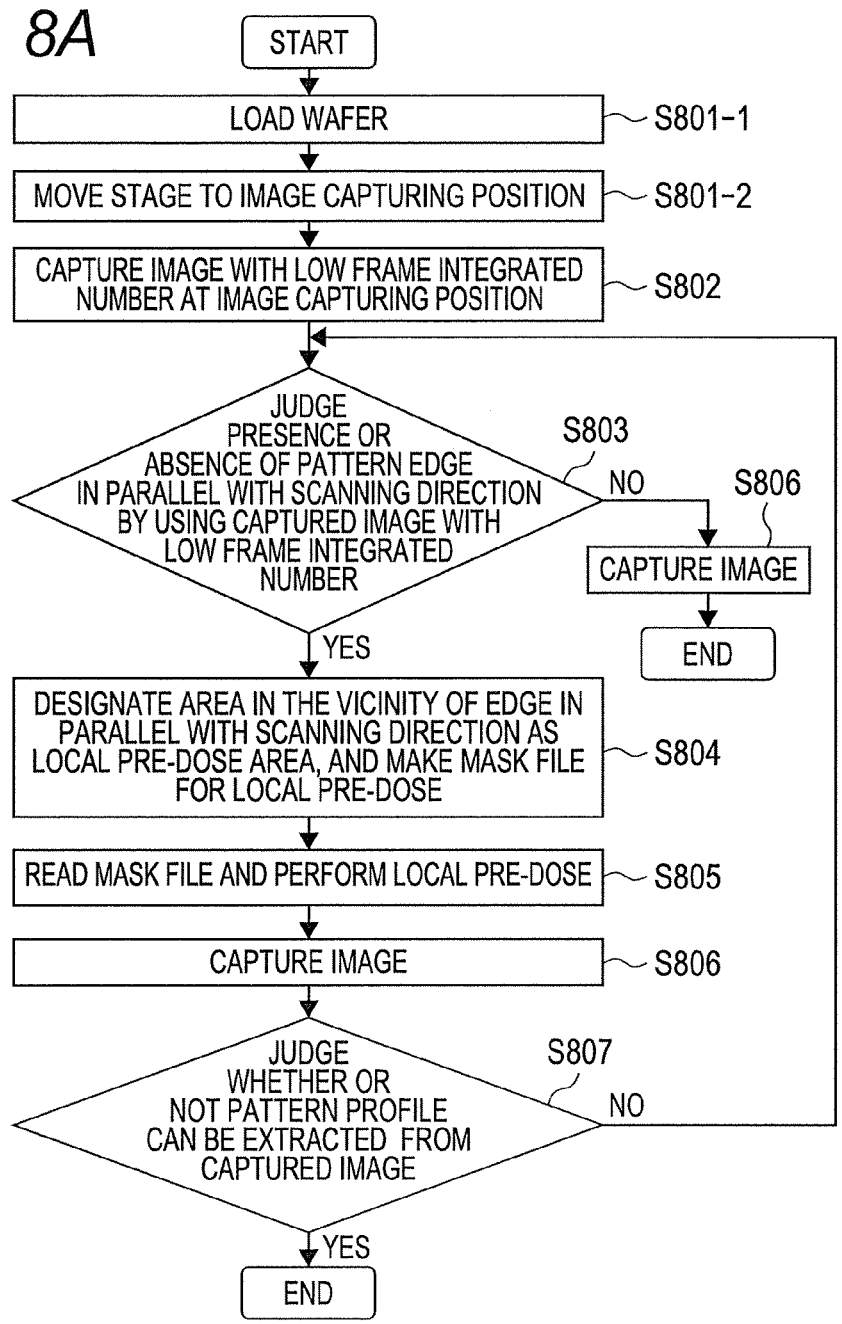
Figure 8B:
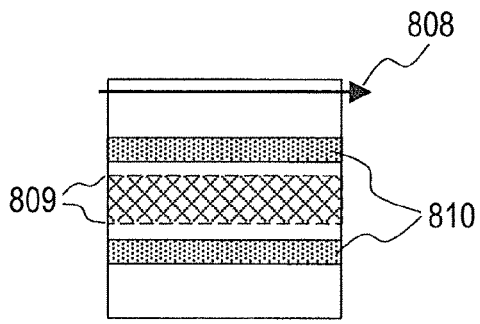
Figure 8C:
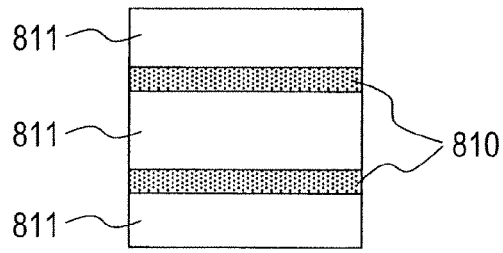

Example 2 will be described referring to FIGS. 8A, 8B and 8C. The description that will not be explained herein is the same as the one which has been explained in the aforementioned [Principle of charge control][Device structure], and Example 1.

In this example, a resist pattern is used as the observation object. A line width and a film thickness of the observation resist pattern are set to 100 nm and 150 nm, respectively. FIG. 8A is a flowchart representing a specific procedure of the sample observation method according to the example.

Likewise Example 1, the wafer is loaded in the sample chamber of the SEM (S801-1), and stage is moved to the image capturing position (S801-2). The condition other than the frame integrated number is set in accordance with the final image capturing condition, and the image of the observation pattern is captured using the frame integrated number smaller than the one for the scanning (S802). The frame integrated number smaller than the one in case of the scanning may be set to be low so long as the pattern layout is identifiable (for example, image with the frame integrated number of 2). The shape information of the observation pattern is captured based on the image with low frame integrated number. The pattern layout judgment function 426 (see FIG. 4) is enabled to judge whether or not the observation object pattern contains the pattern edge in parallel with the electron beam scanning direction (S803).

If it is judged that the relevant pattern edge is not contained (NO), the image of the observation pattern is captured (capturing final image), and the process ends. If it is judged that the relevant pattern is contained (YES), a local pre-dose area designating function 427 (see FIG. 4) is enabled based on the information of the image with low frame integrated number to designate the local pre-dose area as shown in FIG. 8B. The mask file (FIG. 8C) for the local pre-dose is made based on the resultant information (S804). The thus made mask file is stored in the storage unit 421 shown in FIG. 4. Referring to FIGS. 8B and 8C, a reference numeral 808 denotes the electron beam scanning direction, 809 denotes a pattern edge in parallel with the scanning direction, 810 denotes the designated local pre-dose area, and 811 denotes the area to which the electron beam is not irradiated upon the local pre-dose.

The mask file stored in the storage unit 421 (see FIG. 4) is read, and the local pre-dose is performed (S805). The condition for the local pre-dose will be described hereinafter. The local pre-dose area has a start point approximately 20 nm apart from the pattern edge, and a width of 50 nm. Under the electron beam irradiation condition, the irradiation energy is set to 10V, and the dose amount is set to 2330 μC per unit square centimeter.

Upon completion of the local pre-dose, the final image capture condition is selected for capturing the image (S806). Under the electron beam irradiation condition at this time, the irradiation energy is set to 300 V, and the dose amount is set to 440 μC per unit square centimeter. The line profile of the image captured by the line profile extraction function 424 (see FIG. 4) is extracted. The pattern profile extraction judgment function 425 (see FIG. 4) is enabled to calculate the peak intensity of the line profile to judge with respect to possibility of the pattern profile extraction (S807).

If extraction is successful (YES), the process ends. If it is not successful (NO), the pattern is shifted to the new one so that the process is executed from step S803 again. If the observation pattern is formed of the material other than the resist, and the damage under the electron line irradiation is relatively low likewise Example 1, the new pattern shifting is not carried out. The process may be executed on the same position again. As the required time taken from start of the local pre-dose to the end of image capture is in the order of ms, it may be considered that the effect of the pre-dose is sustainable, that is, the amount of change in the charging level is negligible.

This example provides the same effects as those derived from Example 1. The pattern for judging whether the pattern edge in parallel with the electron beam scanning direction exists is captured by using the image data of the sample surface on which the actual pattern is formed. This makes it possible to extract the pattern profile of the unknown pattern having no design information available.

REFERENCE SIGNS LIST

101: scanning order, 102: scanning line number, 103: scanning area, 201: pattern edge, 202: scanning along the direction vertical to the pattern edge, 203: scanning along the direction in parallel with the pattern edge, 301: electron beam, 302: insulator pattern, 303: charging on the sample surface, 304: secondary electron generated by the electron beam irradiation, 305: scanning direction in parallel with the pattern, 306: scanning direction vertical to the pattern, 400: a housing of SEM, 401: cathode, 402: first anode, 403: second anode, 404: primary electron beam, 405: condenser lens, 406: objective lens, 407: throttle plate, 408: sample, 409: secondary electron, 410: deflector, 411: secondary electron detector, 412: signal amplifier, 413: high voltage control power supply, 414: condenser lens control power supply, 415: objective lens control power supply, 416: deflector control power supply, 417: stage control unit, 418: SEM image display unit, 419: input unit, 420: drawing unit, 421: storage unit, 422: control arithmetic unit, 423: sample stage, 424: line profile extraction function, 425: pattern profile extraction judgment function, 426: pattern layout judgment function, 427: local pre-dose area designating function, 440: computer with display unit, 501: electron beam, 502: insulator pattern, 503: negatively charged, 504: state where the secondary electron is not returned to the sample surface owing to negative charge, 505: detected secondary electron, 601: range in which the secondary electron generation efficiency is smaller than 1, 602: range in which the secondary electron generation efficiency is larger than 1, 603: range in which the secondary electron generation efficiency is smaller than 1, 707: electron beam scanning direction, 708: pattern edge in parallel with the scanning direction, 709: designated local pre-dose area, 710: area to which the electron beam is not irradiated upon local pre-dose, 808: electron beam scanning direction, 809: pattern edge in parallel with the scanning direction, 810: designated local pre-dose area, 811: area to which the electron beam is not irradiated upon local pre-dose, 901: electron beam scanning direction.

What is claimed is:

1. A sample observing method using a scanning electron microscope, comprising:
   step of judging presence or absence of a pattern edge having a portion in parallel with a scanning direction of an electron beam of the scanning electron microscope among edges of an observation pattern;
   step of selectively designating an area around the pattern edge that has been judged as the presence in the judgment step as a pre-dose area;
   step of performing a pre-dose with respect to the designated pre-dose area using the electron beam; and
   step of capturing an image of the observation pattern through irradiation of the electron beam.

2. The sample observing method according to claim 1, wherein shape information of the observation pattern for the judgment step is made based on design information of a product.

3. The sample observing method according to claim 1, wherein shape information of the observation pattern used in the judgment step is made using an image with the observation pattern, which is captured with a frame integrated number lower than that for a scanning conducted when capturing an observation image with the observation pattern.

4. The sample observing method according to claim 1, wherein the designated pre-dose area is adjustable in accordance with a size of a pixel for forming the image of the observation pattern.

5. The sample observing method according to claim 1, further comprising step of judging with respect to possibility of extraction of a profile of the observation pattern from the captured images subsequent to the step of capturing the image of the observation pattern.

6. The sample observing method according to claim 5, wherein the step of judging with respect to possibility of extraction of the profile of the pattern is conducted by using a line profile that represents a gradation level of a pattern edge portion.

7. The sample observing method according to claim 5, further comprising:
   step of designating the pre-dose area again when the judgment with respect to possibility of extraction of the pattern profile is negative;
   step of performing the pre-dose by applying the electron beam to the pre-dose area designated again; and
   step of capturing the image of the observation pattern by irradiating the electron beam.

8. A scanning electron microscope which includes an electron source, a deflector for scanning an electron beam extracted from the electron source, a sample stage on which an observation sample is placed, a detector for detecting an electric signal obtained by irradiating the electron beam to the sample on the sample stage, a control arithmetic unit for controlling the electron source, the deflector, the sample stage and the detector, and a computer for converting the electric signal from the detector into a visual signal, which includes a display screen for displaying an image based on the visual signal, wherein:
   the control arithmetic unit further includes a pattern layout judgment function for judging with respect to presence or absence of an edge of those of the observation pattern in parallel with a scanning direction of the electron beam, and a pre-dose area designating function for designating a selected area around the edge of the observation pattern as a pre-dose area when it is judged as the presence of the edge; and the computer further includes a storage unit for storing shape information of the observation pattern formed on the sample, and information of the designated pre-dose area.

9. The scanning electron microscope according to claim 8, wherein the control arithmetic unit includes a line profile extraction function for extracting a profile of the observation pattern.

10. The scanning electron microscope according to claim 9, wherein the control arithmetic unit includes a pattern profile extraction judgment function for judging with respect to possibility of extraction of the profile of the observation pattern which has been extracted by using the line profile extraction function.

11. The scanning electron microscope according to claim 8, wherein:

the computer includes a drawing unit provided with an image memory; and the image memory stores an electric signal detected by the detector.

* * * * *